United States Patent
Yoshizawa

(10) Patent No.: US 9,388,039 B2
(45) Date of Patent: Jul. 12, 2016

(54) MEMS DEVICE AND METHOD OF MANUFACTURING THE SAME

(71) Applicant: SEIKO EPSON CORPORATION, Tokyo (JP)

(72) Inventor: Takahiko Yoshizawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/643,388

(22) Filed: Mar. 10, 2015

(65) Prior Publication Data

US 2015/0274509 A1    Oct. 1, 2015

(30) Foreign Application Priority Data

Mar. 25, 2014  (JP) ................................. 2014-061567

(51) Int. Cl.
| | |
|---|---|
| B81B 7/00 | (2006.01) |
| B81C 1/00 | (2006.01) |
| B81B 3/00 | (2006.01) |

(52) U.S. Cl.
CPC ............ *B81B 7/0041* (2013.01); *B81B 3/0078* (2013.01); *B81C 1/00293* (2013.01); *B81B 2201/0271* (2013.01); *B81C 2203/0136* (2013.01); *B81C 2203/0145* (2013.01); *B81C 2203/0172* (2013.01)

(58) Field of Classification Search
CPC ................... B81C 1/00333; B81C 2203/0136; B81C 2203/0145; B81C 1/00293; B81C 2203/0172; B81B 7/0041
See application file for complete search history.

(56) References Cited

U.S. PATENT DOCUMENTS

| | | | |
|---|---|---|---|
| 2008/0283943 A1 | 11/2008 | Dekker et al. | |
| 2010/0178717 A1 | 7/2010 | Kihara et al. | |
| 2011/0121416 A1* | 5/2011 | Quevy | B81C 1/00333 257/417 |
| 2011/0306153 A1 | 12/2011 | Kihara et al. | |
| 2012/0049390 A1* | 3/2012 | Shimooka | B81C 1/00333 257/790 |
| 2012/0098074 A1* | 4/2012 | Lin | B81C 1/00333 257/414 |

FOREIGN PATENT DOCUMENTS

| | | |
|---|---|---|
| JP | 2006-247815 A | 9/2006 |
| JP | 2008-100325 A | 5/2008 |
| JP | 2009-516346 A | 4/2009 |
| JP | 2010-162629 A | 7/2010 |
| WO | 2007/057814 A2 | 5/2007 |

\* cited by examiner

*Primary Examiner* — Khaja Ahmad
(74) *Attorney, Agent, or Firm* — Oliff PLC

(57) ABSTRACT

A present MEMS device includes: a structural member that is provided on a surface of a substrate and forms a cavity surrounding a functional element; a first layer in which an opening is formed in a predetermined position, the first layer covering a part of the cavity in such a manner that a gap is present between the first layer and the functional element; a second layer in which an opening is formed in a position corresponding to the predetermined position, the second layer being provided on a surface of the first layer; and a sealing portion that is provided on a surface of the second layer across a range broader than the opening of the first layer and the opening of the second layer, and seals at least the opening of the second layer.

6 Claims, 4 Drawing Sheets

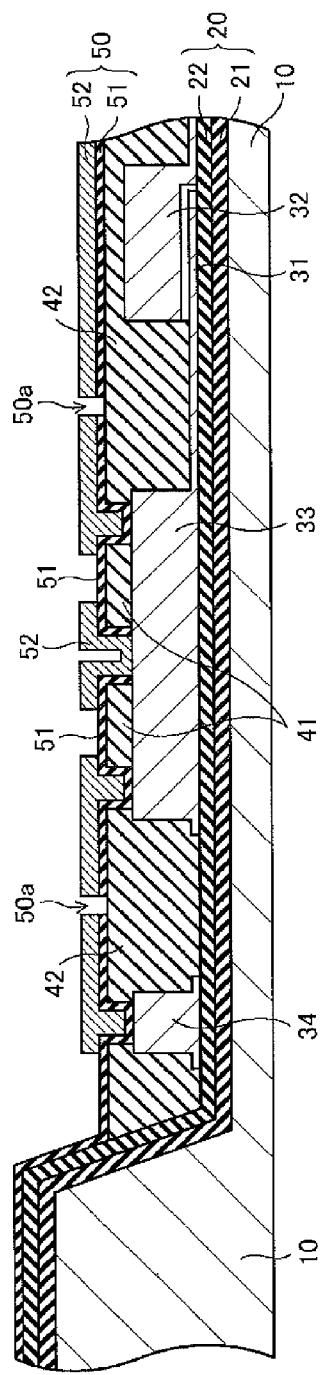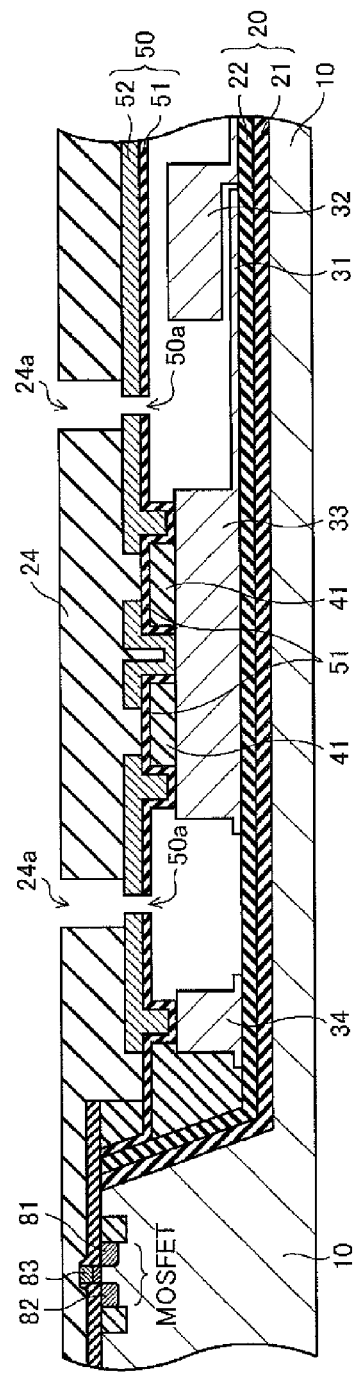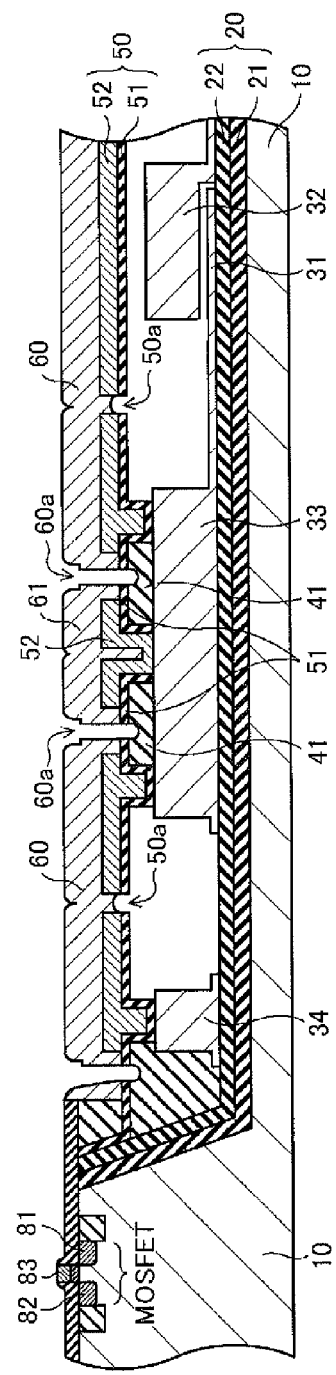

MEMS DEVICE AND METHOD OF MANUFACTURING THE SAME

BACKGROUND

1. Technical Field

The present invention relates to, for example, a MEMS (Micro Electra Mechanical Systems) device in which a functional element, such as a resonator, a sensor and an actuator, and/or an electronic circuit are integrated on one substrate, and a method of manufacturing such a MEMS device.

2. Related Art

For example, in a MEMS device that includes a resonator with capacitance as a functional element, the resonator is airtightly sealed, in a vacuum state, in a cavity formed in a substrate. Also, even in the case of a functional element that does not require airtight vacuum seal, the functional element is airtightly sealed in a cavity so as to prevent the influences of dust, moisture, and the like.

In order to form a cavity in such a MEMS device, for example, a sacrificial film is formed in a cavity provided with a functional element, the cavity is covered by a polysilicon lid portion in which an opening (release hole) is formed, and then the sacrificial film is removed through release etching. Furthermore, in order to seal the release hole, a sealing portion is formed, through sputtering, on the lid portion using a sealant.

However, as the mechanical strength (e.g., Young's modules) of polysilicon is low, the lid portion formed of polysilicon easily deforms in a process for forming the sealing portion on the lid portion through sputtering. On the other hand, forming a thick polysilicon lid portion improves the strength of the lid portion, but undesirably makes it difficult to form a minute release hole in the lid portion. In addition, it is preferable that the lid portion and the sealing portion have a high mechanical strength in, for example, processes for forming an insulating film on the lid portion and the sealing portion and planarizing the insulating film.

As related art, JP-A-2010-162629 (paragraphs 0009, 0033, 0034 and 0057, FIG. 1) discloses a method of manufacturing a MEMS device in which a cavity that houses a MEMS structural member (functional element) is formed on a substrate. This manufacturing method includes: forming, on a substrate, a MEMS structural member and a covering structure with a hollow surrounding the MEMS structural member, the hollow being open to an outside; and performing surface etching for the MEMS structural member in a gas phase by supplying an etching gas in an area surrounding the MEMS structural member from the outside. Here, a part of a wiring layer of aluminum and the like constitutes a lid member that covers an upper side of the MEMS structural member. This lid member is provided with one or more openings, and release etching is applied. Thereafter, a sealing layer is formed on the lid member.

On the other hand, JP-A-2006-247815 (paragraphs 0009, 0015 and 0036 to 0051, FIG. 1) discloses a MEMS system composed of a semiconductor device and a MEMS device. Wiring is formed on the semiconductor device, and the MEMS device is formed integrally on the semiconductor device. This MEMS system includes a mirror portion with a variable mirror. The mirror portion is supported by a hinge portion provided on the semiconductor device, and light is reflected by an Al reflection layer provided on a surface of a mirror base layer of the mirror portion. In order to provide the hinge portion, a sacrificial layer is formed on the semiconductor device, a polysilicon film is formed in a through-hole of the sacrificial layer and on the sacrificial layer, and patterning is applied. The mirror base layer of Ti and the like and the Al reflection layer are formed on a surface of the hinge portion using a sputtering technique and the like, patterning is applied, and then the sacrificial layer is removed through etching.

JP-A-2010-162629 (paragraphs 0009, 0033, 0034 and 0057, FIG. 1) and JP-A-2006-247815 (paragraphs 0009, 0015 and 0036 to 0051, FIG. 1) are examples of related art.

In JP-A-2010-162629 (paragraphs 0009, 0033, 0034 and 0057, FIG. 1), as a part of the wiring layer of aluminum and the like constitutes the lid member of a single-layer structure, there is a possibility that the mechanical strength of the lid member is not sufficient in a case where the sealing layer is formed on the lid member through sputtering. On the other hand, in JP-A-2006-247815 (paragraphs 0009, 0015 and 0036 to 0051, FIG. 1), as a cavity need not have an airtight-seal structure and etching for the sacrificial layer is performed in the final stage, the mechanical strength of the hinge portion does not become a problem at the time of formation or treatment of the mirror base layer and the Al reflection layer.

SUMMARY

A first advantage of some aspects of the invention is that, in a MEMS device with a cavity in which a functional element is provided, the mechanical strength of, for example, a lid portion covering the cavity is improved. A second advantage of some aspects of the invention is that a release hole is easily formed in the lid portion covering the cavity.

A MEMS device according to a first aspect of the invention includes: a substrate; a functional element that is provided, either directly or via an insulating film, on a surface of the substrate; a structural member that is provided on the surface of the substrate or on a surface of the insulating film, and forms a cavity surrounding the functional element; a first layer in which an opening is formed in a predetermined position, the first layer covering a part of the cavity in such a manner that a gap is present between the first layer and the functional element; a second layer in which an opening is formed in a position corresponding to the predetermined position, the second layer being provided on a surface of the first layer; and a sealing portion that is provided on a surface of the second layer across a range broader than the opening of the first layer and the opening of the second layer, and seals at least the opening of the second layer.

Also, a method of manufacturing the MEMS device according to the first aspect of the invention includes: (a) forming a functional element and a structural member, either directly or via an insulating film, on a surface of a substrate, the structural member forming a cavity surrounding the functional element; (b) forming a sacrificial film in the cavity; (c) forming a first layer that covers the cavity, and forming an opening in a predetermined position of the first layer; (d) forming a second layer on a surface of the first layer, and forming, in the second layer, an opening in a position corresponding to the predetermined position; (e) removing the sacrificial film in the cavity through release etching; and (f) forming a sealing portion on a surface of the second layer across a range broader than the opening of the first layer and the opening of the second layer, the sealing portion sealing at least the opening of the second layer.

According to the first aspect of the invention, a lid portion in which a release hole is formed and which covers a part of the cavity has a first layer and a second layer, that is to say, a two-layer structure. Therefore, the mechanical strength of the lid portion can be improved. Furthermore, as the sealing portion is provided on the first and second layers, the mechanical strength of a lid structure covering the cavity is improved.

A MEMS device according to a second aspect of the invention includes: a substrate; a functional element that is provided, either directly or via an insulating film, on a surface of the substrate; a structural member that is provided on the surface of the substrate or on a surface of the insulating film, and forms a cavity surrounding the functional element; a first layer in which an opening is formed in a predetermined position, the first layer covering a part of the cavity in such a manner that a gap is present between the first layer and the functional element; a second layer in which an opening is formed in a position corresponding to the predetermined position, the second layer being provided on a surface of the first layer; a third layer in which an opening larger than the opening of the first layer and the opening of the second layer is formed in a position corresponding to the predetermined position, the third layer being provided on a surface of the second layer; and a sealing portion that is provided on a surface of the third layer across a range broader than the opening of the third layer, is provided on the surface of the second layer across a range broader than the opening of the first layer and the opening of the second layer, and seals at least the opening of the third layer.

According to the second aspect of the invention, by providing the third layer in which the opening larger than the opening of the first layer and the opening of the second layer is formed, the mechanical strength of the lid portion in which the release hole is formed and which covers a part of the cavity can be further improved without obstructing release etching.

It is preferable that a thickness of the above-referenced first layer be smaller than a thickness of the above-referenced second layer. This makes it easy to form a release hole in the first layer. Also, the second layer may cover a side surface of an opening portion of the first layer. In this way, the first layer does not interfere with formation of a release hole in the second layer.

In addition, the first layer and the second layer may be formed of silicon nitride (SiN) and polysilicon, respectively. The first layer formed of silicon nitride (SiN) has a high mechanical strength and high resistance to release etching. Etching for the second layer formed of polysilicon is relatively easy. Therefore, the mechanical strength of the lid portion can be improved, and the release hole can easily be formed in the lid portion. Furthermore, the third layer may be formed of silicon dioxide ($SiO_2$). It is easy to increase a film thickness of the third layer formed of silicon dioxide ($SiO_2$).

BRIEF DESCRIPTION OF THE DRAWINGS

The invention will be described with reference to the accompanying drawings, wherein like numbers reference like elements.

FIGS. 3A and 33 show a second example of the lid structure around the release hole.

FIGS. 5A to 5C are cross-sectional views pertaining to manufacturing processes of the MEMS device according to the embodiment of the invention.

DESCRIPTION OF EXEMPLARY EMBODIMENTS

The following describes an embodiment of the invention in detail with reference to the accompanying drawings. It should be noted that the same constituent element is assigned the same reference sign, and redundant descriptions are omitted.

A MEMS device according to the embodiment of the invention is a device in which a functional element, such as a resonator, a sensor and an actuator, and/or an electronic circuit are integrated on one substrate.

Below, as one example, a MEMS device will be described that includes a resonator with capacitance as a functional element, and also includes a MOS field-effect transistor as a semiconductor circuit element. The resonator is, for example, airtightly sealed in a cavity formed in a trench (a concave portion in a surface) of a semiconductor substrate.

Figure 1:
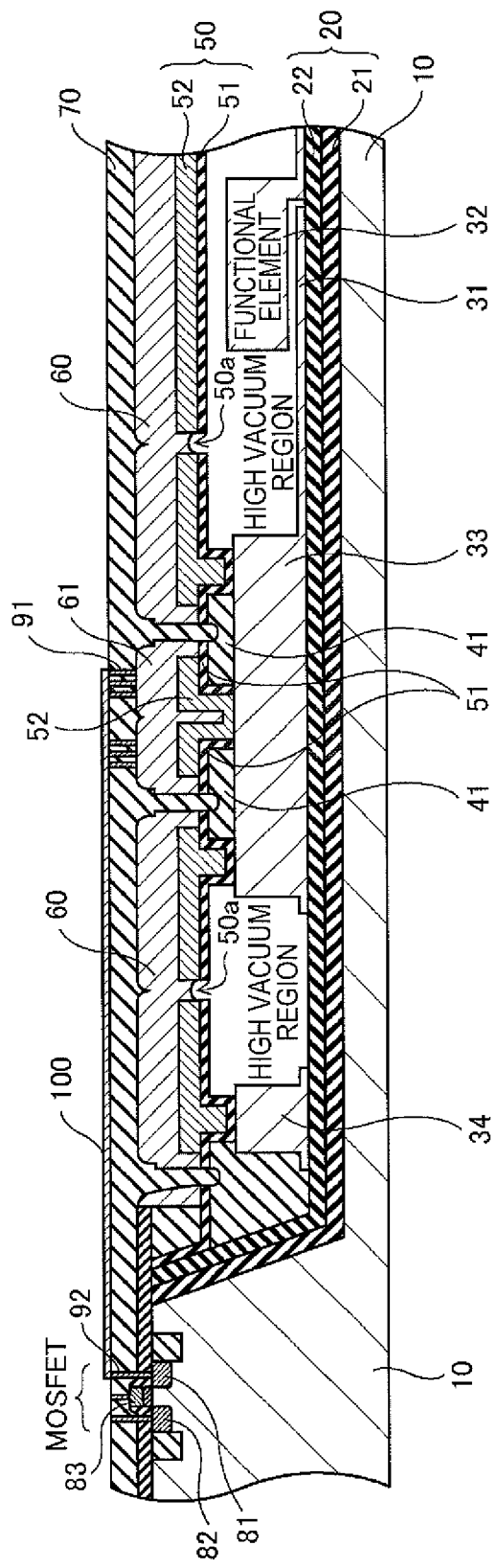
FIG. 1 is a cross-sectional view showing major portions of a MEMS device according to an embodiment of the invention.

FIG. 1 is a cross-sectional view showing major portions of the MEMS device according to the embodiment of the invention. As shown in FIG. 1, this MEMS device uses a semiconductor substrate 10 whose main surface (an upper surface in the figure) has a first region (the right side in the figure) in which a trench is formed and a second region (the left side in the figure) in which impurity diffusion regions of a semiconductor circuit element are formed.

The resonator includes a lower electrode 31, an upper electrode 32 and an external connection electrode 33 that are provided on a bottom surface of the trench of the semiconductor substrate 10 via an insulating film 20. A wall portion 34 is provided as a structural member that forms a cavity surrounding these electrodes. For example, the insulating film 20 includes an insulating film 21 of silicon dioxide ($SiO_2$) and an insulating film 22 of silicon nitride (SiN). It should be noted that the wall portion 34 may be provided directly on the bottom surface of the trench of the semiconductor substrate 10. Also, in a case where a substrate with high insulating properties, such as a substrate of glass, ceramics, resin, or the like, is used, the lower electrode 31 to the external connection electrode 33 may be provided directly on the substrate.

The lower electrode 31 to the wall portion 34 are formed of, for example, polysilicon that has been doped with impurities and has electrical conductivity. The upper electrode 32 of the resonator includes a cantilever-like structural member that is fixed at one end and movable at the other end. The external connection electrode 33 is electrically connected to the lower electrode 31, and may be constructed integrally with the lower electrode 31. It should be noted that, in FIG. 1, an external connection electrode that is electrically connected to the upper electrode 32 is not shown.

In the trench of the semiconductor substrate 10, a region surrounded by the wall portion 34 is the cavity. The space in the cavity is a high vacuum region. By applying an alternating current voltage between the lower electrode 31 and the upper electrode 32 in the resonator provided in the cavity, mechanical oscillation of the upper electrode 32 is excited by an electrostatic force, and a change in capacitance between the lower electrode 31 and the upper electrode 32 attributed to this mechanical oscillation is detected.

The cavity is covered by a lid portion 50 and a sealing portion 60 in such a manner that a gap is present between them and the resonator. An opening (release hole) 50a is formed in the lid portion 50. Parts of the lid portion 50 other than the release hole 50a cover the cavity. The release hole 50a is used in removing, through release etching, a sacrificial film formed in the cavity. With the inside of the cavity placed in a decompressed state (vacuum state), the sealing portion 60 and an intermediate conductive member 61 are formed on a surface of the lid portion 50 by a sealant of aluminum (Al) and the like.

Figure 2:
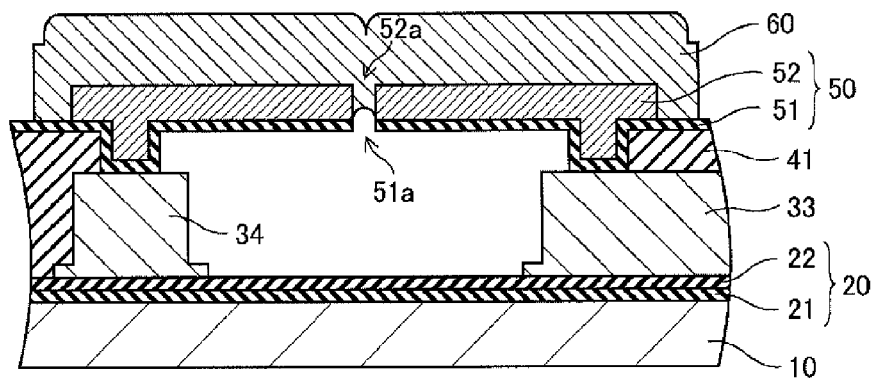
FIG. 2 is a cross-sectional view showing a first example of a lid structure around a release hole.

FIG. 2 is a cross-sectional view showing a first example of a lid structure around the release hole. The lid portion 50 has at least a two-layer structure. In the first example, the lid portion 50 includes an insulating film 51 of silicon nitride (SiN) as a first layer, and a polysilicon film 52 that has electrical conductivity as a second layer. It should be noted that a surface of the polysilicon film 52 that comes into contact with the sealing portion 60 or the intermediate conductive member 61 (FIG. 1) may be provided with a titanium nitride (TiN) film, a salicide film, or the like.

A release hole 51a is formed in a predetermined position of the insulating film 51. Parts of the insulating film 51 other than the release hole 51a cover the cavity in such a manner that a gap is present between them and the resonator (FIG. 1). The polysilicon film 52 is provided on a surface of the insulating film 51 of silicon nitride (SiN). In the polysilicon film 52, a release hole 52a is formed in a position corresponding to the predetermined position. It should be noted that this surface of the insulating film 51 of silicon nitride (SiN) and a face of the insulating film 51 opposing a functional element 32 represent front and back faces.

As set forth above, in the first example, the lid portion 50, in which the release hole is formed and which covers a part of the cavity, includes the insulating film 51 of silicon nitride (SiN) and the polysilicon film 52. The insulating film 51 has a high mechanical strength and high resistance to release etching. Etching for the polysilicon film 52 is relatively easy. Therefore, the mechanical strength of the lid portion 50 can be improved, and the release hole can easily be formed in the lid portion 50.

A diameter of the release hole 51a formed in the insulating film 51 may be the same as or different from a diameter of the release hole 52a formed in the polysilicon film 52. The sealing portion 60 is provided on the surface of the polysilicon film 52 across a range that is broader than the release hole 51a of the insulating film 51 and the release hole 52a of the polysilicon film 52, and seals at least the release hole 52a of the polysilicon film 52.

As the sealing portion 60 is thus provided on the insulating film 51 and the polysilicon film 52, the mechanical strength of the lid structure that covers the cavity can be improved. Aluminum is suitable as a material of the sealing portion 60 that realizes sealing of the high-vacuum cavity, which is required in a high-performance MEMS device.

Figure 3A:
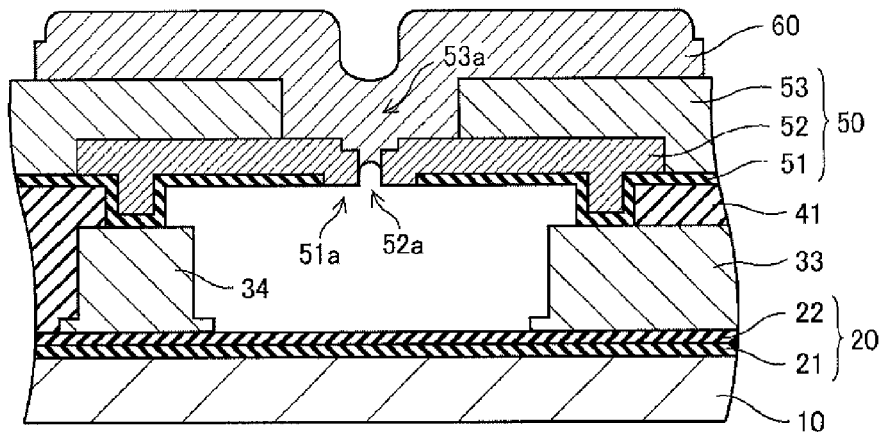
Figure 3B:
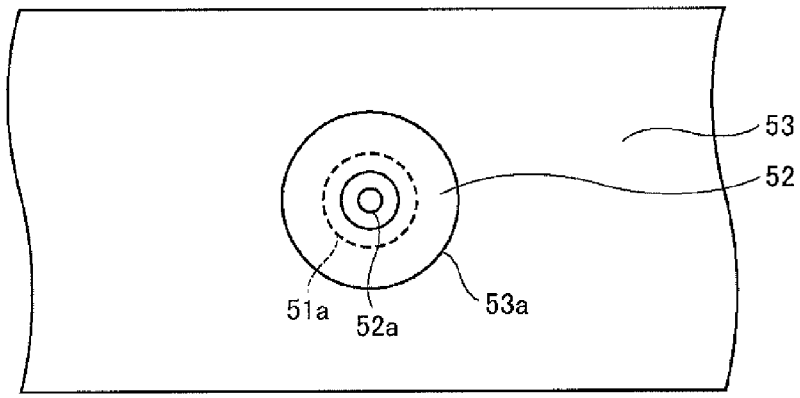

FIGS. 3A and 3B show a second example of the lid structure around the release hole. FIG. 3A is a cross-sectional view showing the lid structure around the release hole, and FIG. 3B is a plan view showing the lid portion before the sealing portion is formed. In the second example, the lid portion 50 includes the insulating film 51 of silicon nitride (SiN) as a first layer, the polysilicon film 52 that has electrical conductivity as a second layer, and an insulating film 53 of silicon dioxide (SiO$_2$) as a third layer. It should be noted that the surface of the polysilicon film 52 that comes into contact with the sealing portion 60 or the intermediate conductive member 61 (FIG. 1) may be provided with a titanium nitride (TiN) film, a salicide film, or the like.

The release hole 51a is formed in a predetermined position of the insulating film 51. Parts of the insulating film 51 other than the release hole 51a cover the cavity in such a manner that a gap is present between them and the resonator (FIG. 1). The polysilicon film 52 is provided on the surface of the insulating film 51 of silicon nitride (SiN). In the polysilicon film. 52, the release hole 52a is formed in a position corresponding to the predetermined position.

The insulating film 53 is provided on the surface of the polysilicon film 52. In the insulating film 53, a release hole 53a that is larger than the release hole 51a of the insulating film 51 and the release hole 52a of the polysilicon film 52 is formed in a position corresponding to the predetermined position. In this way, the mechanical strength of the lid portion 50, in which the release hole is formed and which covers a part of the cavity, can be further improved without obstructing release etching. In a case where the insulating film 53 is formed of silicon dioxide (SiO$_2$), it is easy to increase a film thickness thereof.

The sealing portion 60 is provided on a surface of the insulating film 53 across a range that is broader than the release hole 53a of the insulating film 53, and is provided on the surface of the polysilicon film 52 across a range that is broader than the release hole 51a of the insulating film 51 and the release hole 52a of the polysilicon film 52. The sealing portion 60 seals at least the release hole 53a of the insulating film 53.

In the first or second example, it is preferable that a thickness of the insulating film 51 be smaller than a thickness of the polysilicon film 52. This makes it easy to form the release hole 51a in the insulating film 51. Also, as shown in FIGS. 3A and 3B, the diameter of the release hole 51a formed in the insulating film 51 may be larger than the diameter of the release hole 52a formed in the polysilicon film 52, and the polysilicon film 52 may cover a side surface of an opening portion of the insulating film 51. In this way, the insulating film 51 does not interfere with formation of the release hole 52a in the polysilicon film 52.

Referring back to FIG. 1, the external connection electrode 33 has, for example, a shape of a flat prism or cylinder, and an insulating film 41 of silicon dioxide (SiO$_2$) and the like is provided so as to surround a predetermined region on a main surface (an upper surface in the figure) of the external connection electrode 33. The insulating film 51 that constitutes the lid portion 50 covers the insulating film 41 at the main surface of the external connection electrode 33.

Also, a part of the polysilicon film 52 is provided in the predetermined region of the main surface of the external connection electrode 33, and is electrically connected to the external connection electrode 33. The intermediate conductive member 61 is electrically connected to the predetermined region of the main surface of the external connection electrode 33 via the polysilicon film 52, and is insulated from the sealing portion 60.

An insulating film 70 of silicon dioxide (SiO$_2$), BPSG (Boron Phosphorus Silicon Glass), or the like is provided on the surfaces of the sealing portion 60 and the intermediate conductive member 61. The insulating film 70 is in contact with the insulating film 41 or 51, and insulates the intermediate conductive member 61 from the sealing portion 60. As shown in FIG. 1, the insulating film 70 may come into contact with the insulating film 41 by penetrating the sealing portion 60 and the insulating film 51 around the intermediate conductive member 61. In this way, the insulating film 41, the insulating film 51 and the insulating film 70 can reliably insulate and isolate the intermediate conductive member 61 from the sealing portion 60.

The insulating film 70 may extend to a second region of the semiconductor substrate 10 in which the semiconductor circuit element is formed. The semiconductor circuit element is provided in the second region of the semiconductor substrate 10. For example, impurity diffusion regions 81 and 82, which serve as a source and a drain of a MOS field-effect transistor (MOSFET), are provided inside the semiconductor substrate 10, and a gate electrode 83 is provided on the semiconductor substrate 10 via a gate insulating film.

A contact plug (electrode) 91 of tungsten (W) and the like is provided in a first region of the semiconductor substrate 10. The contact plug 91 penetrates the insulating film 70 and is electrically connected to the intermediate conductive member 61. Also, for example, a contact plug (electrode) 92 of tungsten (W) and the like is provided in the second region of the semiconductor substrate 10. The contact plug 92 penetrates at least the insulating film 70 and is electrically connected to the impurity diffusion regions 81 and 82 and the gate electrode 83.

For example, wiring 100 of aluminum (Al) and the like, which is provided on a surface of the insulating film 70, brings the contact plug 91 and the contact plug 92 into electrical connection to each other. In this way, the external connection electrode 33 of the resonator can be electrically connected to the MOS field-effect transistor.

A description is now given of a method of manufacturing the MEMS device shown in FIG. 1.

Figures 4A, 4B, 4C:
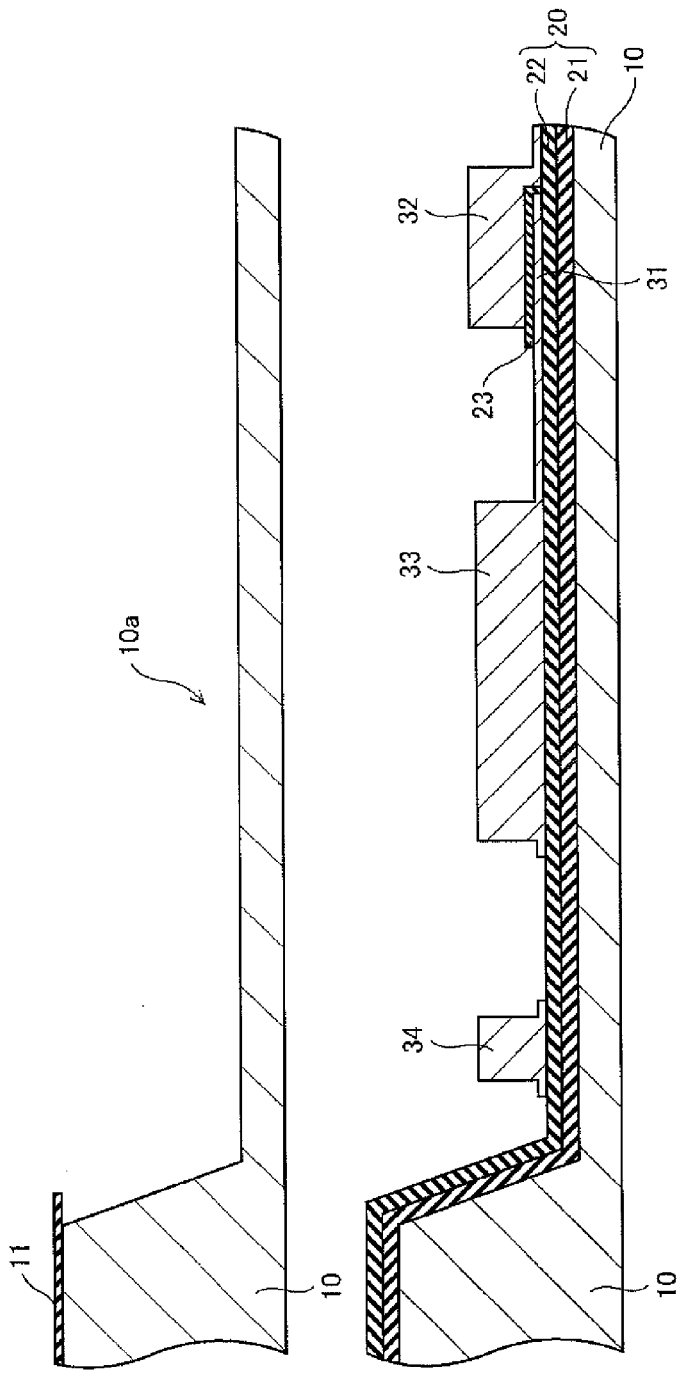
FIGS. 4A to 4C are cross-sectional views pertaining to manufacturing processes of the MEMS device according to the embodiment of the invention.

FIGS. 4A to 5C are cross-sectional views pertaining to manufacturing processes of the MEMS device according to the embodiment of the invention. First, for example, by providing a resist 11 using a photolithography technique and applying dry etching to a part of the main surface of the semiconductor substrate 10 constructed from a silicon monocrystal and the like, a deep trench 10a is formed in the first region of the main surface of the semiconductor substrate 10 as shown in FIG. 4A. Thereafter, the resist 11 is removed.

Next, as shown in FIG. 4B, the insulating film 20 is formed on a bottom surface of the trench of the semiconductor substrate 10. For example, the insulating film 20 includes the insulating film 21 of silicon dioxide ($SiO_2$) and the insulating film 22 of silicon nitride (SiN). The insulating film 22 of silicon nitride (SiN) withstands wet etching (release etching) for removing the later-described sacrificial film in the cavity.

Also, for example, polysilicon that has been doped with impurities and has electrical conductivity is formed on the bottom surface of the trench of the semiconductor substrate 10 via the insulating film 20, and patterning is applied through dry etching that uses a resist. Consequently, the lower electrode 31 of the resonator is formed. Furthermore, after forming a gap sacrificial film 23 on the lower electrode 31, for example, polysilicon that has electrical conductivity is formed, and patterning is applied through dry etching that uses a resist. Consequently, the upper electrode 32 and the external connection electrode 33 of the resonator and the wall portion 34 are formed. Thereafter, the gap sacrificial film 23 is removed through wet etching.

In this way, the resonator including the external connection electrode, as well as the wall portion 34, which is the structural member that forms the cavity surrounding the resonator, is formed on the bottom surface of the trench of the semiconductor substrate 10 via the insulating film 20. It should be noted that the wall portion 34 may be provided directly on the bottom surface of the trench of the semiconductor substrate 10. Also, in a case where a substrate with high insulating properties, such as a substrate of glass, ceramics, resin, or the like, is used, the lower electrode 31 to the external connection electrode 33 may be provided directly on the substrate.

Next, after an insulating film of silicon dioxide ($SiO_2$) and the like is deposited, using a plasma CVD technique, on the surface of the semiconductor substrate 10 on which the resonator and the like are formed, the insulating film of silicon dioxide ($SiO_2$) and the like is polished by CMP (Chemical Mechanical Polishing), and patterning is applied through etching. As a result, as shown in FIG. 4C, the insulating film 41 of silicon dioxide ($SiO_2$) and the like is formed so as to surround a predetermined region 33a on a surface of the external connection electrode 33, and an insulating film 42 of silicon dioxide ($SiO_2$) and the like is formed as a sacrificial film in the cavity.

Next, after an insulating film of silicon nitride (SiN) and the like, which covers the insulating films 41 and 42, is formed, patterning is applied to the insulating film of silicon nitride (SiN) and the like through dry etching that uses a resist, and a release hole is formed in a predetermined position of the insulating film of silicon nitride (SiN) and the like. As a result, as shown in FIG. 5A, the insulating film 51 of silicon nitride (SiN) and the like is formed. The insulating film 51 covers the insulating film 41 at the main surface of the external connection electrode 33, and covers a part of the cavity.

Also, after a polysilicon film that has electrical conductivity is formed on the surface of the insulating film 51, patterning is applied to the polysilicon film through dry etching that uses a resist, and a release hole is formed in the polysilicon film in a position corresponding to the predetermined position. As a result, as shown in FIG. 5A, the lid portion 50 having the insulating film 51 and the polysilicon film 52, that is to say, a two-layer structure is formed.

Alternatively, as shown in FIGS. 3A and 3B, the lid portion 50 of a three-layer structure may be formed by forming the insulating film 53 of silicon dioxide ($SiO_2$) and the like on the surface of the polysilicon film 52. In this case, after an insulating film of silicon dioxide ($SiO_2$) and the like is formed on the surface of the polysilicon film 52, patterning is applied to the insulating film of silicon dioxide ($SiO_2$) and the like through dry etching that uses a resist, and a release hole is formed in the insulating film of silicon dioxide ($SiO_2$) and the like in a position corresponding to the predetermined position.

Consequently, in the insulating film 53 of silicon dioxide ($SiO_2$) and the like, a release hole that is larger than the release hole of the insulating film 51 and the release hole of the polysilicon film 52 is formed in the position corresponding to the predetermined position. As shown in FIGS. 3A and 3B, the above-referenced polysilicon film 52 may cover the side surface of the opening portion of the above-referenced insulating film 51.

In the lid portion 50 formed in the above-described manner, the release hole 50a is formed. Parts of the lid portion 50 other than the release hole 50a cover the cavity. Here, a part of the polysilicon film 52 is provided in the predetermined region of the main surface of the external connection electrode 33, and is electrically connected to the external connection electrode 33.

Next, on the surface of the semiconductor substrate 10 on which the lid portion 50 and the like are formed, for example, grooves are formed, an insulating film of silicon dioxide ($SiO_2$) and the like is formed, and insulating film planarization is applied. Thereafter, for example, a MOS field-effect transistor (MOSFET) is formed as a semiconductor circuit element in the second region of the semiconductor substrate 10 as shown in FIG. 5B.

That is to say, the gate electrode 83 is formed on the semiconductor substrate 10 via the gate insulating film, and the impurity diffusion regions 81 and 82 that serve as the source and the drain are formed inside the semiconductor substrate 10 on both sides of the gate electrode 83. Also, insulating side walls may be formed on side walls of the gate insulating film and the gate electrode 83. Furthermore, an insulating film of a predetermined thickness may be formed in a region surrounding the insulating side walls.

In addition, a resist 24 that has an opening 24a in a position corresponding to the release hole 50a of the lid portion is provided, using a photolithography technique, on the surface of the semiconductor substrate 10 on which the MOS field-effect transistor and the like are formed. Furthermore, the sacrificial film in the cavity is removed through wet etching (release etching) that uses hydrofluoric acid and the like as an etchant. Thereafter, the resist 24 is removed through aching and the like.

Next, a sealant of aluminum (Al) and the like is deposited on the surface of the lid portion 50 through sputtering (a high vacuum film formation technique) in a vacuum chamber, and patterning is applied to the deposited sealant through dry etching that uses a resist. In this way, as shown in FIG. 5C, the sealing portion 60 and the intermediate conductive member 61 are formed on the surface of the lid portion 50 by the sealant of aluminum (Al) and the like.

The sealing portion 60 is provided on the surface of the polysilicon film 52 across a range that is broader than the release hole of the insulating film 51 and the release hole of the polysilicon film 52, and seals at least the release hole of the polysilicon film 52. The intermediate conductive member 61 is electrically connected to a predetermined region of the external connection electrode 33 via the polysilicon film 52. Also, an opening 60a, which penetrates the sealing portion 60 and the insulating film 51 and extends to the insulating film 41, is formed through dry etching that uses a resist.

Next, as shown in FIG. 1, the insulating film 70 of silicon dioxide ($SiO_2$), BPSG, or the like is formed on the surfaces of the sealing portion 60 and the intermediate conductive member 61. The insulating film 70 is in contact with the insulating film 41 or 51, and insulates the intermediate conductive member 61 from the sealing portion 60. As shown in FIG. 1, the insulating film 70 may come into contact with the insulating film 41 by penetrating the sealing portion 60 and the insulating film 51.

The insulating film 70 may extend to the second region of the semiconductor substrate 10 in which the MOS field-effect transistor is formed. In this case, the contact plugs 91 and 92 of tungsten (W) and the like are simultaneously formed. The contact plug 91 penetrates the insulating film 70 and is electrically connected to the intermediate conductive member 61, whereas the contact plug 92 penetrates the insulating film 70 and is electrically connected to the MOS field-effect transistor. Thereafter, the contact plugs 91 and 92 are brought into electrical connection to each other by forming the wiring 100 of aluminum (Al) and the like on the surface of the insulating film 70.

While the above-described embodiment has discussed a MEMS device with a cavity that is formed in a deep trench of a semiconductor substrate, the invention is by no means limited to the above-described embodiment. For example, the invention can be utilized in a MEMS device with a cavity that is formed in a shallow trench of a substrate or on the substrate, and can be modified in many ways by a person of ordinary skill in the art within the technical ideas of the invention.

The entire disclosure of Japanese Patent Application No. 2014-061567, filed Mar. 25, 2014 is expressly incorporated by reference herein.

What is claimed is:

1. A MEMS device, comprising:
   a substrate;
   a functional element that is provided, either directly or via an insulating film, on a surface of the substrate;
   a structural member that is provided on the surface of the substrate or on a surface of the insulating film, and forms a cavity surrounding the functional element, the structural member not extending above an upper surface of the functional element, an upper surface of the functional element extends above an upper surface of the structural member relative to the substrate;
   an external connection electrode provided between the functional element and the structural member, the external connection electrode having a thickness equal to a thickness of the functional element and the structural member;
   a first layer in which an opening is formed in a predetermined position, the first layer covering a part of the cavity in such a manner that a gap is present between the first layer and the functional element;
   a second layer in which an opening is formed in a position corresponding to the predetermined position, the second layer being provided on a surface of the first layer; and
   a sealing portion that is provided on a surface of the second layer across a range broader than the opening of the first layer and the opening of the second layer, and seals at least the opening of the second layer.

2. A MEMS device, comprising:
   a substrate;
   a functional element that is provided, either directly or via an insulating film, on a surface of the substrate;
   a structural member that is provided on the surface of the substrate or on a surface of the insulating film, and forms a cavity surrounding the functional element;
   an external connection electrode provided between the functional element and the structural member, the external connection electrode having a thickness equal to a thickness of the functional element and the structural member;
   a first layer in which a first opening is formed in a predetermined position, the first layer covering a part of the cavity in such a manner that a gap is present between the first layer and the functional element;
   a second layer in which a second opening smaller than the first opening is formed in a position corresponding to the predetermined position, the second layer being provided on a surface of the first layer;
   a third layer in which a third opening larger than the first opening of the first layer and larger than the second opening of the second layer is formed in a position corresponding to the predetermined position, the third layer being provided on a surface of the second layer; and
   a sealing portion that is provided on a surface of the third layer across a range broader than the opening of the third layer, is provided on the surface of the second layer across a range broader than the opening of the first layer and the opening of the second layer, and seals at least the opening of the third layer.

3. The MEMS device according to claim 1, wherein a thickness of the first layer is smaller than a thickness of the second layer.

4. The MEMS device according to claim 1, wherein the second layer covers a side surface of an opening portion of the first layer.

5. The MEMS device according to claim 1, wherein the first layer is formed of silicon nitride (SiN), and the second layer is formed of polysilicon.

6. The MEMS device according to claim 2, wherein the third layer is formed of silicon dioxide ($SiO_2$).

* * * * *